(12) United States Patent
Shirakawa

(10) Patent No.: US 10,566,448 B2
(45) Date of Patent: Feb. 18, 2020

(54) INSULATED GATE BIPOLAR TRANSISTOR

(71) Applicant: FUJI ELECTRIC CO., LTD., Kawasaki-shi (JP)

(72) Inventor: Tohru Shirakawa, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/171,535

(22) Filed: Oct. 26, 2018

(65) Prior Publication Data

US 2019/0181252 A1    Jun. 13, 2019

(30) Foreign Application Priority Data

Dec. 12, 2017 (JP) ................. 2017-237922

(51) Int. Cl.
| | |
|---|---|
| *H01L 29/739* | (2006.01) |
| *H01L 29/08* | (2006.01) |
| *H01L 29/10* | (2006.01) |
| *H01L 29/40* | (2006.01) |
| *H01L 29/06* | (2006.01) |
| *H01L 29/423* | (2006.01) |
| *H01L 29/417* | (2006.01) |

(52) U.S. Cl.
CPC ...... *H01L 29/7395* (2013.01); *H01L 29/0615* (2013.01); *H01L 29/0692* (2013.01); *H01L 29/0696* (2013.01); *H01L 29/0804* (2013.01); *H01L 29/1004* (2013.01); *H01L 29/1095* (2013.01); *H01L 29/407* (2013.01); *H01L 29/4238* (2013.01); *H01L 29/417* (2013.01)

(58) Field of Classification Search
CPC .... H01L 29/73; H01L 29/739; H01L 29/7395
See application file for complete search history.

(56) References Cited

U.S. PATENT DOCUMENTS

| | | | |
|---|---|---|---|
| 8,008,715 B2 | 8/2011 | Kawaguchi et al. | |
| 9,006,839 B2 | 4/2015 | Misumi | |
| 2009/0032875 A1 | 2/2009 | Kawaguchi et al. | |
| 2014/0346561 A1 | 10/2014 | Misumi | |
| 2015/0255587 A1* | 9/2015 | Nagaoka | H01L 29/4238 257/139 |
| 2015/0349103 A1* | 12/2015 | Onozawa | H01L 29/7397 257/144 |

FOREIGN PATENT DOCUMENTS

| | | |
|---|---|---|
| JP | 2009038318 A | 2/2009 |
| JP | 2014229798 A | 12/2014 |

* cited by examiner

*Primary Examiner* — Fazli Erdem

(57) ABSTRACT

An IGBT includes current sense cell having a sensing area for sensing a current flowing an active area and an extraction area for extracting a hole current. The extraction area around the sensing area, has a portion in a gate trench is not in contact with the emitter region, and a p-type well region provided deeper than the first trench and having a high impurity concentration. An area of the extraction area is four times or more and 10,000 times or less an area of the sensing area.

13 Claims, 10 Drawing Sheets

INSULATED GATE BIPOLAR TRANSISTOR

CROSS REFERENCE TO RELATED APPLICATIONS

This application is based upon and claims the benefit of priority from the prior Japanese Patent Application No. P2017-237922 filed on Dec. 12, 2017, the entire contents of which are incorporated herein by reference.

BACKGROUND OF THE INVENTION

1. Field of the Invention

The present invention relates to an insulated gate bipolar transistor (IGBT) with a trench gate structure.

2. Description of the Related Art

An IGBT is known as a semiconductor device incorporated in an intelligent power module (IPM) for industrial use. For example, in some cases, the IGBT may include a current sense cell for sensing a main current flowing in an active area on the same semiconductor chip along with the IGBT of the active area, as described in JP 2014-229798 A. JP 2014-229798 A discloses a structure in which a p-type diffusion layer, which surrounds the IGBT structure formed in the sensing area, is provided separately from a p-type diffusion layer in the main region implementing the active area of the IGBT.

At the time of assembling the semiconductor package or assembling miscellaneous circuits for application including the IGBT on the customer side, to which the IGBT is delivered, electrostatic discharge (ESD) may occur in the IGBT due to human or mechanical factors. When a voltage equal to or higher than the gate breakdown voltage is applied to the IGBT by ESD, dielectric breakdown may occur in the gate insulating film of the current sense cell, and the main current sensing capability by the current sense cell will be lost. Then, the protection function against the overcurrent of the IGBT will not work sufficiently, and destruction of the IGBT may occur.

In order to increase ESD tolerance, JP 2009-038318 A has proposed a technique to increase the surface area of the gate wiring. In JP 2009-038318 A, the trench gate structure electrically connected to the gate wiring is provided under the gate wiring in the active area of the trench gate IGBT so as to increase the surface area of the gate wiring.

However, as the result of the investigation, when the gate potential is applied to the gate electrode by providing the gate electrode in the region other than the sensing area of the current sense cell using the technique of JP 2009-038318 A, it has been found that the balance of the gate-collector capacitance $C_{gc}$ between the active area and the current sense cell has collapsed.

SUMMARY OF THE INVENTION

An aspect of the present invention inheres in an IGBT encompassing a current sense cell, including: (a) a drift layer of a first conductivity type; (b) a base region of a second conductivity type provided on the drift layer; (c) an emitter region of the first conductivity type provided on a part of the base region and having a higher impurity concentration than the drift layer; (d) a gate electrode buried in a first trench penetrating through at least the base region via a first insulating film; and (e) a collector region of the second conductivity type provided under the drift layer; wherein the current sense cell includes; a sensing area in which the emitter region is provided, having a portion in contact with the emitter region in the first trench, configured to sense a current flowing in an active area; and an extraction area around the sensing area, in which the emitter region is not provided, having a portion in the first trench not in contact with the emitter region and having a first well region of the second conductivity type in an upper layer of the drift region, configured to extract a hole current flowing from the collector region through the first well region, wherein the first well region is provided deeper than the first trench and has a higher impurity concentration than the base region, and an area of the extraction area is four times or more and 10,000 times or less an area of the sensing area in the planar pattern.

DETAILED DESCRIPTION

Figure 1:
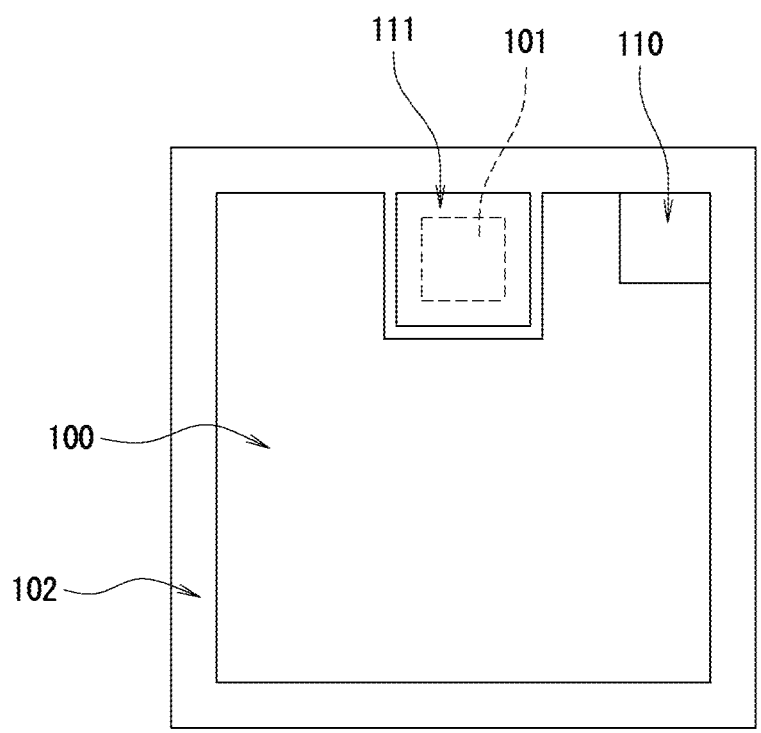
FIG. 1 is a schematic plan view illustrating an example of a structure of an IGBT according to an embodiment of the present invention.

Exemplary embodiments of the present invention will be described below with reference to the drawings. In the descriptions of the drawings to be referred, the same or similar elements are indicated by the same or similar reference numerals. It should be understood that the drawings are illustrated schematically, and relationships of thicknesses and planar dimensions, and thickness proportions of the respective devices and elements are not drawn to scale. The specific thicknesses and dimensions should be considered in accordance with the following descriptions. It should also be understood that the respective drawings are illustrated with the dimensional relationships and proportions different from each other.

In the Specification and the appended drawings, the superscript "+" or "−" added to the mark "n" or "p" denotes that a semiconductor region has a higher or lower impurity concentration than a region without the superscript "+" or "−" added. Further, in the following explanation, it is technically and logically obvious that a constituent member, component or a semiconductor region to which a limitation of a "first conductivity type" or a "second conductivity type" is added means a constituent member, component or a semiconductor region made of a semiconductor material without particular limitation. In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top".

<Structure of IGBT>

As illustrated in FIG. 1, an IGBT according to an embodiment of the present invention is a trench gate IGBT which includes an active area 100 occupying a large percentage of a main surface in a planar pattern and a rectangular current sense cell 101 provided inside the active area 100. The active area 100 and the current sense cell 101 are provided on a single semiconductor chip. An outer-edge area 102 having a rectangular frame-shape is provided around the active area 100 and the current sense cell 101 as a breakdown-voltage improving-area of the IGBT.

A rectangular gate pad 110 is provided at the upper right corner of the active area 100 in FIG. 1. The gate pad 110 are electrically connected to a gate electrode provided in the active area 100 and a gate electrode provided in the current sense cell 101, by a gate wiring. Illustration of the gate wiring is omitted in FIG. 1. A sense pad 111 having a peripheral area larger than the current sense cell 101 is exemplified in FIG. 1. The sense pad 111 is provided on the current sense cell 101 so as to cover the peripheral area of the current sense cell 101. The peripheral of the sense pad 111 is disposed slightly spaced apart from the inner portion of the U shape of the active area 100.

The current sense cell 101 has a unit cell structure to be the same as each of the unit cell structures of transistors through which a current flows in the active area 100. The current sense cell 101 is directly connected to an external integrated circuit (IC) not illustrated in the drawing by a wire and the like. The integrated circuit is connected to a microcomputer via a shunt resistor, for example, and detects a current generated in the current sense cell 101. The magnitude of the main current flowing in the active area 100 is detected by multiplying the magnitude of the detected current with the area ratio of a sensing area of the current sense cell 101 to the active area 100. When the detected main current is equal to or larger than the predetermined value, the operation of the IGBT is stopped and protected from damage due to overcurrent.

Figure 2:
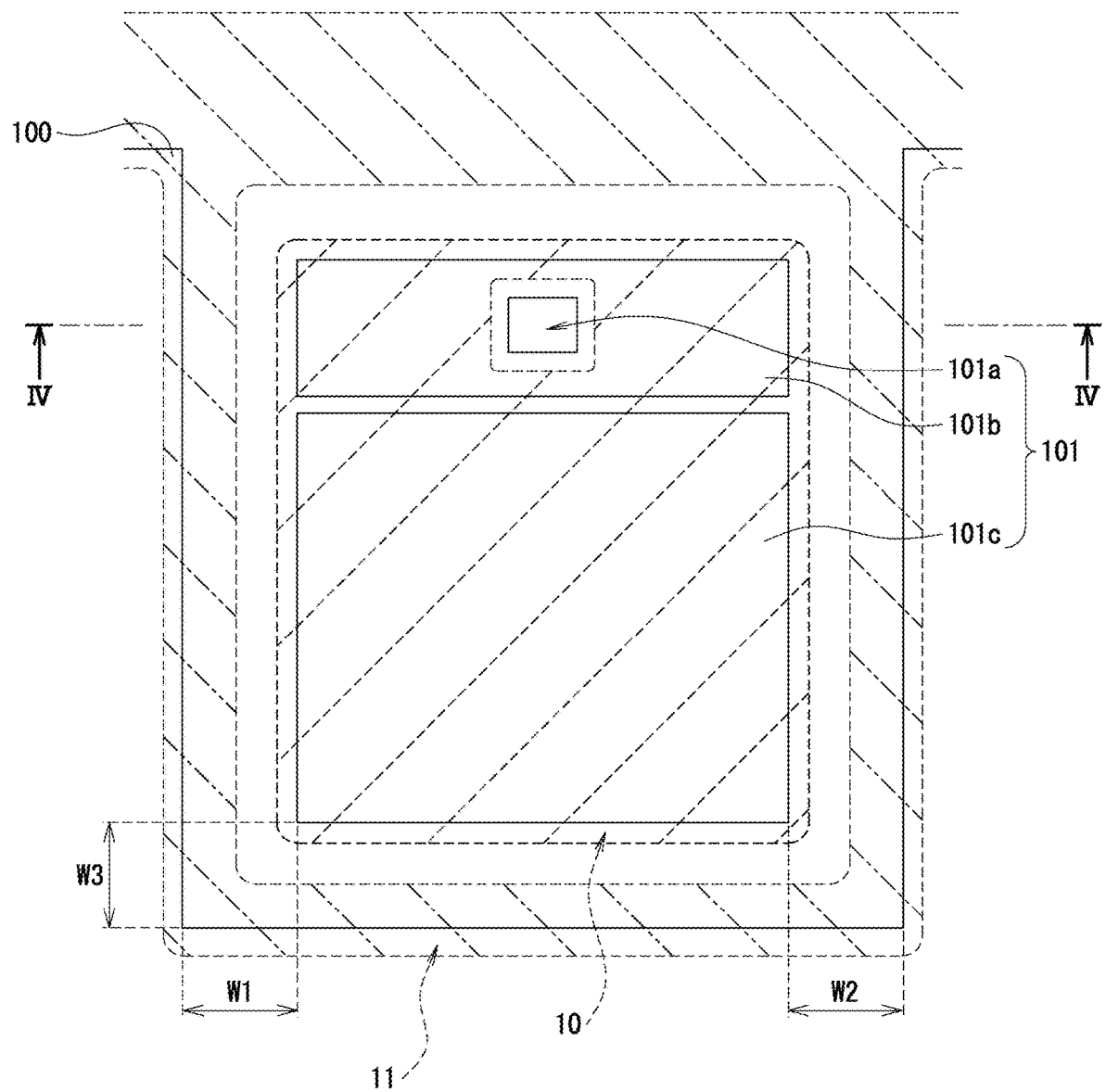
FIG. 2 is a schematic plan view illustrating an example of a structure of a current sense cell included in the IGBT according to the embodiment.

FIG. 2 schematically illustrates the current sense cell 101 and the periphery of the current sense cell 101 except for the sense pad 111 illustrated in FIG. 1. As illustrated in FIG. 2, the current sense cell 101 includes a first extraction area 101b in a frame shape and a second extraction area 101c separated from the first extraction area 101b with a gap, as a planar pattern. The first extraction area 101b and the second extraction area 101c implement an "extraction area" of the present invention.

A sensing area 101a having a rectangular peripheral area is disposed inside the frame of the first extraction area 101b and at the center of the first extraction area 101b. In entire of the sensing area 101a, the first extraction area 101b and the second extraction area 101c, a plurality of trenches are provided so as to be parallel to each other in a longitudinal direction of the trenches which corresponds to the vertical direction in FIG. 2. The gap between the first extraction area 101b and the second extraction area 101c has a strip-shape extending parallel to the left-right direction, or a shorter-side direction of the trenches as a planar pattern, and the width of the gap measured along the vertical direction in FIG. 2 is uniform.

An interval w1 is a distance between the first extraction area 101b and the adjacent active area 100 on the left side in FIG. 2, or a distance between the second extraction area 101c and the adjacent active area 100 on the left side. An interval w2 is a distance between the first extraction area 101b and the adjacent active area 100 on the right side in FIG. 2, or a distance between the second extraction area 101c and the adjacent active area 100 on the right side. An interval w3 is a distance between the second extraction area 101c and the active area 100 on the lower side in FIG. 2, or a distance between the first extraction area 101b and the active area 100 on the upper side in FIG. 2. That is, the intervals w1, w2, w3 are the distances from the end of the first extraction area 101b or the second extraction area 101c to the active area 100. The intervals w1, w2, w3 are preferably set to 50 micrometers or more from the viewpoint of decreasing the interference by the currents, which are spreading from the active area 100 to the current sense cell 101, when the IGBT performs the switching operation.

In FIG. 2, an occupying area of the upper surface of a well region 10 is illustrated with a hatched area with dotted lines as a planar pattern. The well region 10 is provided in an area surrounding both of the first extraction area 101b and the second extraction area 101c except for the sensing area 101a. An occupying area of the upper surface of a well region 11 is illustrated by a hatched area with two-dot chain lines as a planar pattern. The well region 11 is provided outside the well region 10 so as to surround the well region 10 and to overlap a portion of the active area 100. Although not illustrated, the well region 11 provided on the side of the active area 100 is located on the periphery of the IGBT along the outer-edge area 102 illustrated in FIG. 1 so as to surround the active area 100, and is also provided under the gate pad 110.

Figure 3:
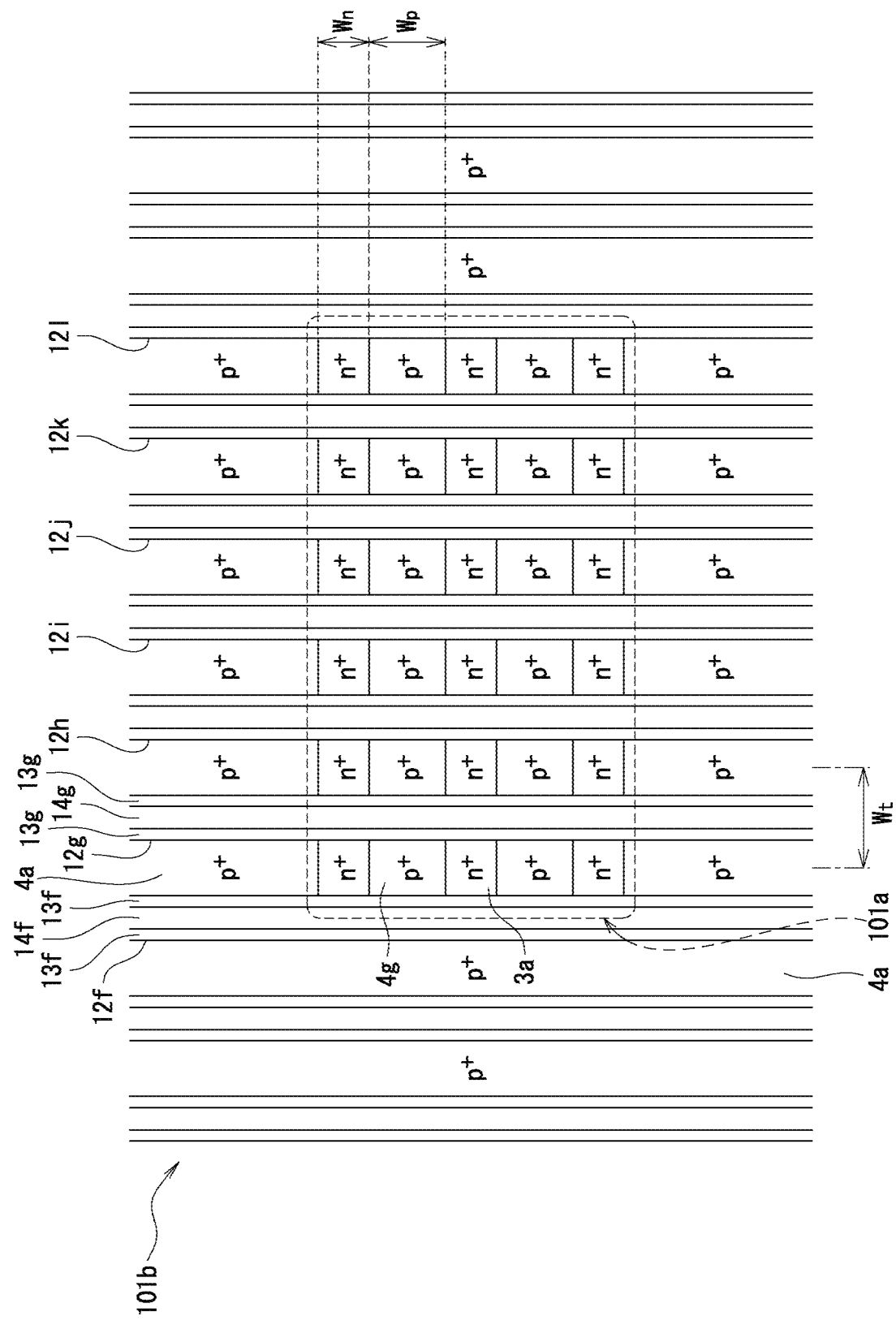
FIG. 3 is a schematic plan view illustrating an example of a structure of a sensing area of the current sense cell of the IGBT according to the embodiment.

FIG. 3 is a plan view partially illustrating a state in which a layer, such as an interlayer insulating film, above the drift layer 1 is removed from the sensing area 101a and the first extraction area 101b around the sensing area 101a. As illustrated in FIG. 3, in the upper side of the current sense cell 101, a plurality of trenches extend in parallel in a strip-shape, as a planar pattern, and the center portion of the region where the trenches are provided is used as the sensing area 101a. Each pitch $w_t$ between the adjacent center lines along the extending direction of the trenches, as a planar pattern, may be about 2.0 micrometers to 4.0 micrometers and a groove width of each trench may be about 0.8 micrometer to 2.8 micrometers.

In the sensing area 101a, for example, four gate trenches 12f, 12h, 12j, 12l are alternately arranged with gap spaces, and three dummy trenches 12g, 12i, 12k are assigned in the gap spaces penetrating between the four gate trenches 12f, 12h, 12j, 12l. The sensing area 101a spans an area between the gate trench 12f at the left end and the gate trench 12l at the right end, in the lateral direction in FIG. 3.

A plurality of first conductivity type ($n^+$-type) emitter regions 3a and a plurality of second conductivity type ($p^+$-type) base contact regions 4g having a higher impurity concentration than the base region are alternately arranged along the extending direction of the trenches, or the longitudinal direction of the trenches between adjacent trenches in the sensing area 101a. Each width $w_n$ of the emitter regions 3a measured along the longitudinal direction of the gate trenches 12f, 12h, 12j, 12l and the dummy trenches 12g, 12i, 12k may be about 1.0 micrometer to about 2.0 micrometers, and each width $w_p$ of the base contact regions 4g measured along the longitudinal direction of the gate trenches 12f, 12h, 12j, 12l and the dummy trenches 12g, 12i, 12k may be about 0.5 micrometer to about 1.5 micrometers. In the sensing area 101a illustrated with a dotted line in FIG. 3, each of the four gate trenches 12f, 12h, 12 j, 12l and the three dummy trenches 12g, 12i, 12k includes a portion in contact with each emitter region 3a which is connected to the emitter potential.

In an area in which all the trenches including the four gate trenches 12f, 12h, 12j, 12l and the three dummy trenches 12g, 12i, 12k are provided, an area around the outside of the sensing area 101a is used as the first extraction area 101b. In the first extraction area 101b, both trenches located at the left end and the right end outside the sensing area 101a, or both ends in the lateral direction of the gate trenches in the sensing area 101a in FIG. 3 are the gate trenches 12f, 12l. Inside each gate trench, a gate electrode is buried via a gate insulating film. In the first extraction area 101b, only a plurality of $p^+$-type base contact regions 4a is provided between the adjacent gate trenches, and n-type regions such as the emitter regions are not provided.

Moreover, each portion located above and below the outside of the sensing area 101a, which is the area where four gate trenches 12f, 12h, 12j, 12l and the three dummy trenches 12g, 12i, 12k are alternately arranged in FIG. 3, is not in contact with n-type emitter regions. That is, the first extraction area 101b located vertically and horizontally around the sensing area 101a is implemented by portions in contact with the $p^+$-type base contact regions but not in contact with the n-type emitter regions in the gate trenches and the dummy trenches.

Figure 4:
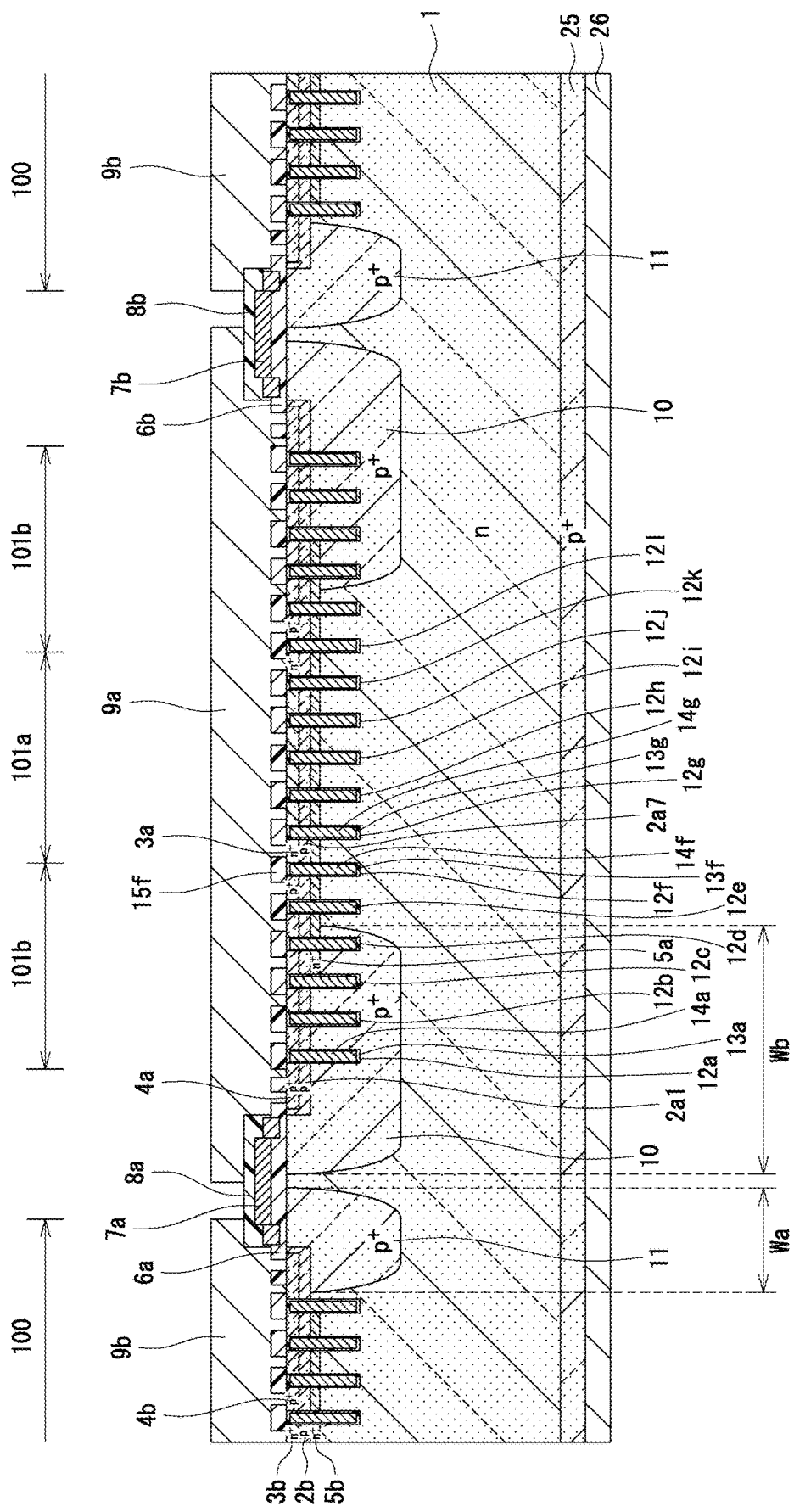
FIG. 4 is a cross-sectional view taken along line IV-IV in FIG. 2.

As illustrated in FIG. 4, an n-type drift layer 1 made of silicon (Si) or the like, and a p-type base region 2a7 disposed at an surface layer of the drift layer 1 are arranged in the sensing area 101a of the current sense cell 101. In a surface layer of the base region 2a7, the $n^+$-type emitter region 3a having a higher impurity concentration than the drift layer 1 is arranged. The seven trenches 12f, 12g, 12h, 12i, 12j, 12k, 12l are provided so as to penetrate through the emitter region 3a and the base region 2a7. In the sensing area 101a of the current sense cell 101 illustrated in FIG. 4, the seven trenches including the gate trench 12f located at the boundary between the sensing area 101a and the first extraction area 101b on the left side, and the gate trenches 12h, 12j, 12l and the dummy trenches 12g, 12i, 12k located on the right side of the gate trench 12f are provided.

In the sensing area 101a, four trenches among the seven trenches 12f, 12g, 12h, 12i, 12j, 12k, 12l are used as the gate trenches 12f, 12h, 12j, 12l. For example, the gate electrode 14f is buried inside the gate trench 12f located at the left end in FIG. 4, via the first insulating film 13f which is a gate insulating film. The gate electrode 14f is electrically connected to the same gate potential as the gate electrode in the active area 100. Similarly, the gate electrodes are also buried in the three gate trenches 12h, 12j, 12l other than the gate trench 12f via the gate insulating films, and the respective gate electrodes of the gate trenches 12h, 12j, 12l are also electrically connected to the gate potential. Each of the four gate trenches 12f, 12h, 12j, 12l corresponds to a "first trench" of the present invention.

In the sensing area 101a, the remaining three trenches excluding the four gate trenches 12f, 12h, 12j, 12l are used as the dummy trenches 12g, 12i, 12k. The dummy trenches 12g, 12i, 12k are provided so as to penetrate through the base region 2a7 and the emitter region 3a. For example, the dummy trench 12g is located on the right side of the gate trench 12f in FIG. 4. The dummy electrode 14g is buried inside the dummy trench 12g via the second insulating film 13g, and electrically connected to the emitter potential. Each of three dummy trenches 12g, 12i, 12k corresponds to a "second trench" of the present invention. In addition, the "dummy trench" means a trench having the same structure as a gate trench including an insulating film and an electrode, but not connected to a gate voltage control circuit.

In the sensing area 101a of the current sense cell 101, the gate trenches 12f, 12h, 12j, 12l and the dummy trenches 12g, 12i, 12k are alternately arranged in parallel with equal pitches and spaced from each other. In other words, also in the active area 100 of the IGBT, the gate trenches 12f, 12h, 12j, 12l in which the gate electrodes are buried and the dummy trenches 12g, 12i, 12k in which the dummy electrodes electrically connected to the emitter potential are buried, are alternately assigned in parallel.

As illustrated in detail in the first extraction area 101b on the left side of the sensing area 101a in FIG. 4, the n-type drift layer 1 and the p-type base region 2a1 disposed in the surface layer of the drift layer 1 are provided in the first extraction area 101b. The $p^+$-type base contact region 4a having a higher impurity concentration than the base region 2a1 is provided in the surface layer of the base region 2a1, and a plurality of gate trenches 12a, 12b, 12c, 12d, 12e are provided so as to penetrate the base region 2a1 and the base contact region 4a.

In FIG. 4, the sensing area 101a is provided so as to be sandwiched by the first extraction area 101b. Further, the sensing area 101a may be surrounded by the first extraction area 101b. In the first extraction area 101b on the left side in FIG. 4, the gate trench 12a positioned at the left end of the first extraction area 101b and the four gate trenches 12b, 12c, 12d, 12e on the right side of the gate trench 12a are provided. A gate electrode 14a is buried in the leftmost gate trench 12a via a first insulating film 13a which is the gate insulating film. The gate electrode 14a is connected to the gate potential similarly to the gate electrode of the active area and the gate electrode 14f of the sensing area 101a of the current sense cell 101.

As with the gate trench 12a, gate electrodes are buried in the other four gate trenches 12b, 12c, 12d, 12e via first insulating films which are the gate insulating films, and the respective gate electrodes are connected to the gate potential. Along with the gate trenches 12f, 12h, 12i, 12l, each of the gate trenches 12a, 12b, 12c, 12d, 12e correspond to the "first trench" of the present invention. Although the five gate trenches 12a, 12b, 12c, 12d, 12e provided in the first extraction area 101b in FIG. 4 are exemplified for the convenience of explanation, a much larger number, for example, twenty, thirty or more of gate trenches, may be arranged in practice. As a number of the gate trenches in the first extraction area 101b increases, gate-emitter capacitance $C_{ge}$ can be increased, and thus ESD tolerance can be improved.

In the surface layer of the drift layer 1 in the first extraction area 101b on the left side in FIG. 4, the $p^+$-type well region 10 having a higher impurity concentration than the base region 2a1 is provided so as to be adjacent to the $p^+$-type well region 11 provided on the tip of the active area 100 which is located on the left side adjacent to the first extraction area 101b. The well region 10 of the first extraction area 101b is provided so as to have a thickness deeper than the gate trenches 12a to 12e. Several gate trenches in the gate trenches 12a to 12e are provided within the well region 10. Therefore, the effectiveness of decreasing gate-collector capacitance $C_{gc}$ may increase. A width wb of the well region 10 may be set to be 1.5 to 300 times a width wa of the well region 11 of the active area 100.

In the case of the IGBT illustrated in FIG. 4, the width wb of the well region 10 extending from the first extraction area 101b toward the active area 100 is set to about 2.5 times the width wa of the well region 11 extending from the active area 100 toward the first extraction area 101b. In the well region 10 of the first extraction area 101b, during the operation of the active area 100 and the sensing area 101a, it is possible to prevent charging in the trenches with holes by extracting the carrier (hole) currents in the active area 100 and the sensing area 101a toward the first extraction area 101b side and by flowing the hole currents to the region 101a side. When the width wb of the well region 10 of the first extraction area 101b is, for example, eight times or more larger than the width wa of the well region 11 of the active area 10, it is possible to sufficiently prevent the charging the trenches with the hole current. However, when the width wb is 1.5 times less than the width wa of the well region 11 of the active area 100, the charging of the trenches with the hole current may not be sufficiently prevented. Furthermore, when the width wb exceeds 300 times larger than the width wa, the area of the current sense cell 101 becomes too large with respect to the area of the active area 100, and the area of the semiconductor chip becomes extremely large, or the area (effective area) of the active area 100 decreases. Therefore, there is a concern that the cost of the semiconductor chip may increase and the characteristics may deteriorate.

As illustrated in FIG. 4, across the sensing area 101a and the first extraction area 101b located on the left and right side of the sensing area 101a, an n+-type accumulation layer 5a having a higher impurity concentration than the drift layer 1 is buried under the base region 2a1 and the base region 2a7. The accumulation layer 5a is provided so as to be sandwiched between the drift layer 1 and the base region 2a7 or the base region 2a1. Therefore, it is possible to reduce the resistance of the lower part of the base region 2a1 and the base region 2a7 by accumulating the carriers, and to flow more electron current. The accumulation layer 5a can be achieved by implanting n-type impurity ions from the surface of the drift layer 1, for example. In addition, the accumulation layer 5a may not be provided and the upper surface of the drift layer 1 may be in contact with the base region 2a7 and the base region 2a1 at the corresponding level of the upper surface of the accumulation layer 5a in FIG. 4.

In addition, in the first extraction area 101b on the right side of the sensing area 101a in FIG. 4, similarly to the first extraction area 101b on the left side, a unit cell structure of the IGBT having the n-type drift layer 1, the p-type base region, the base contact region and the gate trenches is provided. The first extraction area 101b on the right side has a structure symmetrical to the first extraction area 101b on the left side. Since each constituent member included in the first extraction area 101b on the right side has a structure equivalent to each constituent member having the same name included in the first extraction area 101b on the left side, the redundant description will be omitted.

In the upper surface side of the drift layer 1, an interlayer insulating film 15f is laminated on each of the gate trenches 12f, 12h, 12j, 12l and the dummy trenches 12g, 12i, 12k provided in the sensing area 101a, and each of the gate trenches 12a to 12e provided in the first extraction area 101b. Moreover, on the upper surface side of the drift layer 1, first boundary interlayer insulating films 6a and 6b are laminated at boundary positions between the first extraction area 101b of the current sense cell 101 and the active area 100, and gate wirings 7a,7b are provided on the first boundary interlayer insulating films 6a, 6b, respectively. On the gate wirings 7a,7b, second boundary interlayer insulating films 8a, 8b are laminated, respectively.

An emitter electrode 9a is provided on the interlayer insulating film 15f and the second boundary interlayer insulating films 8a, 8b of the sensing area 101a and the first extraction area 101b. The emitter electrode 9a is in contact with each of the emitter regions 3a of the sensing area 101a and the base contact regions 4a of the first extraction area 101b.

On the lower surface of the drift layer 1, a p+-type collector region 25 having a higher impurity concentration than the base region 2a1, for example, the impurity concentration of about $1 \times 10^{16}$ cm$^{-3}$ to $1 \times 10^{18}$ cm$^{-3}$, is buried across the current sense cell 101 and the active area 100. On the lower surface of the collector region 25, a collector electrode 26 is provided so as to be in contact with the collector region 25.

In the active area 100, a plurality of unit cells same as the unit cells included in the sensing area 101a of the current sense cell 101 are periodically arranged so as to implement a multi-channel structure in which a large current flows. In the active area 100 on the left side of the current sense cell 101 in FIG. 4, a p-type base region 2b, an n+-type emitter region 3b, a p+-type base contact region 4b and an n+-type accumulation layer 5b is exemplified. Even in the active area 100, a plurality of gate trenches which penetrate the base region 2b and the emitter region 3b are provided, and an emitter electrode 9b is formed above each gate trench via an interlayer insulating film so as to be in contact with the emitter region 3b and the base contact region 4b.

Additionally, as illustrated in FIG. 4, the active area 100 on the right side of the current sense cell 101 has a symmetrical structure with the active area 100 on the left side. Since each constituent member included in the active area 100 on the right side has a structure equivalent to each constituent member having the same name included in the active area 100 on the left side, the redundant description will be omitted.

The accumulation layer in the sensing area 101a of the current sense cell 101, the accumulation layer 5a in the first extraction area 101b, and the accumulation layer 5b in the active area 100 may be simultaneously formed on a semiconductor chip by a process procedure including an ion implantation of n-type impurity ions, activation annealing and the like using a photolithography technique, an etching technique and the like. Similarly, the base region 2a7 of the sensing area 101a, the base region 2a1 of the first extraction area 101b, and the base region 2b of the active area 100 may also be simultaneously formed by implantation of p-type impurity ions. The emitter region 3a of the sensing area 101a and the emitter region 3b of the active area 100 may be simultaneously formed by implantation of n-type impurity ions.

Although not illustrated in FIG. 4, as illustrated in FIG. 3, the base contact region 4g is provided in parallel to the emitter region 3b in the sensing area 101a. The base contact region 4g of the sensing area 101a, the base contact region 4b of the first extraction area 101b, and the base contact region 4a of the active area 100 may also be simultaneously formed by implantation of p-type impurity ions.

The gate trenches 12f, 12h, 12j, 12l and the dummy trenches 12g, 12i, 12k in the sensing area 101a, the gate trenches 12a in the first extraction area 101b, and the gate trenches in the active area 100 may be simultaneously formed by a reactive ion etching (RIE) and the like. The first insulating film 13f and the second insulating film 13g in the sensing area 101a, the first insulating film 13a in the first extraction area 101b, and the first insulating film in the active area 100 may be simultaneously formed by a thermal oxidation method, a chemical vapor deposition (CVD) method and the like.

Similarly, the gate electrodes 14f and the dummy electrodes 14g of the sensing area 101a, the gate electrodes 14a of the first extraction area 101b, and the gate electrodes of the active area 100 may be simultaneously formed. For example, a polysilicon layer doped with impurities at a high concentration (doped polysilicon layer) may be deposited by a CVD method and the like so as to bury the gate trenches 12a, 12f, 12h, 12j, 12l and the dummy trenches 12g, 12i, 12k. For the collector electrode 26, for example, a single layer film made of gold (Au) or a multilayer film of a metal laminated in the order of aluminum (Al), nickel (Ni), Au may be used, and further a metal plate, such as molybdenum (Mo), tungsten (W) and the like, may be inserted at the bottom layer.

The interlayer insulating film 15f of the sensing area 101a, the interlayer insulating film of the first extraction area 101b, and the interlayer insulating film of the active area 100 may be simultaneously formed by the CVD method and the like. The emitter electrode 9a of the sensing area 101a, the emitter electrode 9a of the first extraction area 101b, and the emitter electrode 9b of the active area 100 may also be simultaneously formed by depositing an aluminum (Al) film, for example.

In the second extraction area 101c of the current sense cell 101 illustrated in FIG. 2, the same unit cell structure as that of the first extraction area 101b is provided. Like the first extraction area 101b, the second extraction area 101c has a plurality of gate trenches and a gate electrode buried in each gate trench via a gate insulating film. The second extraction area 101c is different from the first extraction area 101b in that the second extraction area 101c has a larger area than the first extraction area 101b. However, the second extraction area 101c has equivalent structure and function as the first extraction area 101b, and thus redundant description is omitted.

Figure 5:
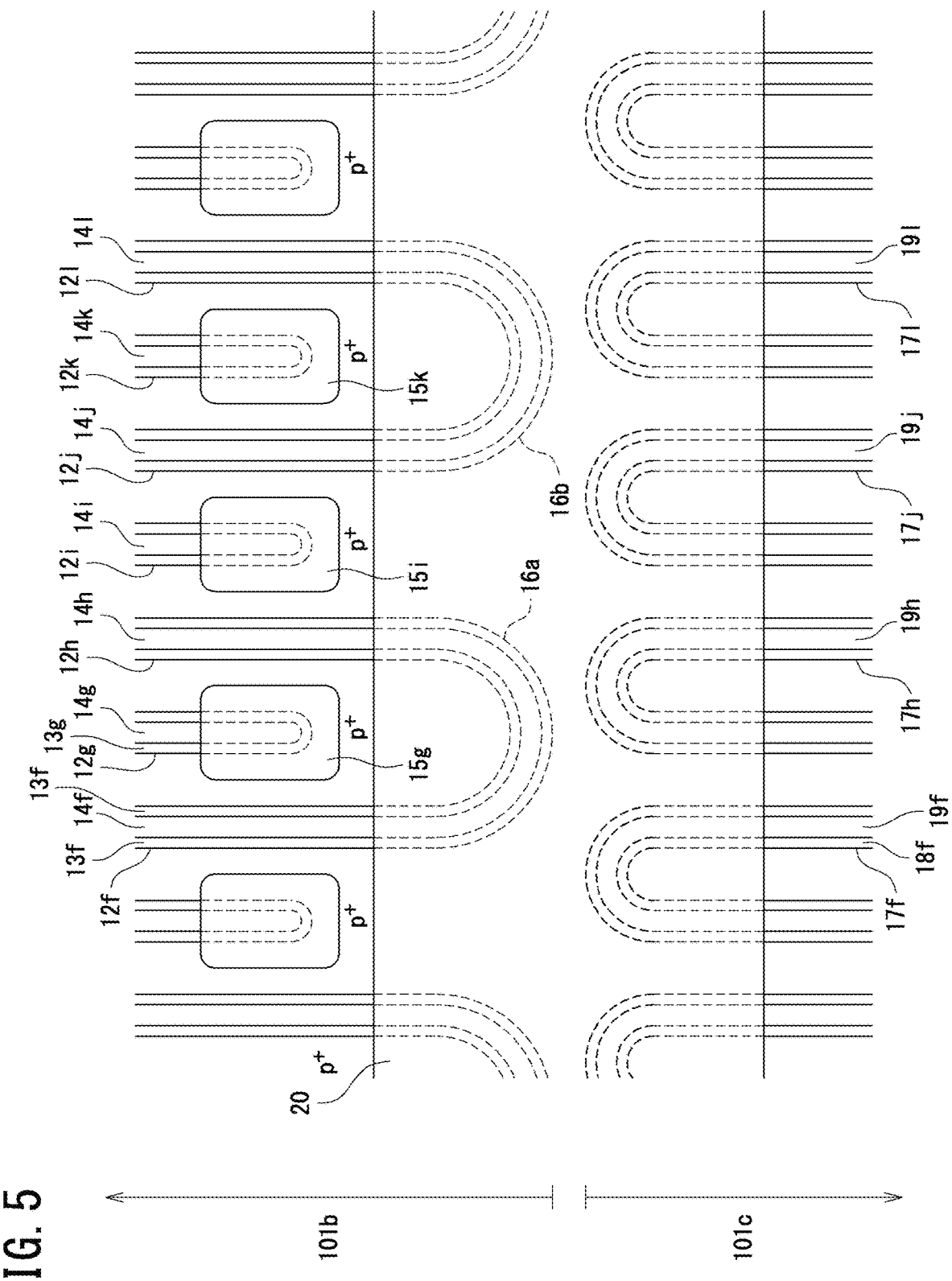
FIG. 5 is a schematic plan view illustrating an example of a structure at a boundary between a first extraction area and a second extraction area of the current sense cell of the IGBT according to the embodiment.

As illustrated in FIG. 5, an interspace is provided between the first extraction area 101b and the second extraction area 101c as a planar pattern. In an area at the upper side of the interspace in FIG. 5, each of the lower tips of the gate trenches 12f, 12h, 12j, 12l and the dummy trenches 12g, 12i, 12k, which extend in the first extraction area 101b, faces the interspace. On the other hand, in an area at the lower side of the interspace between the first extraction area 101b and the second extraction area 101c, each of the upper tips of the gate trenches 17f, 17h, 17j, 17l in the second extraction area 101c faces the interspace. That is, the lower tips of the gate trenches 12f, 12h, 12j, 12l extending in the first extraction area 101b and the upper tips of the gate trenches 17f, 17h, 17j, 17l in the second extraction area 101c face each other in the interspace along the extending direction of the trenches, or the longitudinal direction of the trenches.

Each width of the gate trenches 12f, 12h, 12j, 12l in the first extraction area 101b and the gate trenches 17f, 17h, 17j, 17l in the second extraction area 101c is the same. Also, each thickness of the gate insulating films inside the trenches is the same and each width of the gate electrodes buried in the trenches is the same.

In the four gate trenches 12f, 12h, 12j, 12l extending in the first extraction area 101b, the lower tips of the gate trench 12f located in the most left side from the center in FIG. 5 and the gate trench 12h located in the second left side from the center are coupled to left and right ends of an arc-shaped coupling trench 16a so as to implement U-shape in a planar pattern. A gate electrode is also buried inside the coupling trench 16a via a gate insulating film. For the two gate trenches 12f, 12h and the coupling trench 16a, each width of the trenches is the same, each thickness of the gate insulating films is the same, and each width of the gate electrodes is the same. The two gate trenches 12f and 12h and the coupling trench 16a implement an U-shaped unified gate trench. Moreover, the lower tips of the two gate trenches 12j, 12l located at the right side from the center in FIG. 5 are also coupled to left and right ends of a coupling trench 16b respectively, similarly to the case of the two gate trenches 12f and 12h, and the gate trenches 12j, 12l and the coupling trench 16b implement a unified U-shaped gate trenches.

The extending direction of the gate trench 12f in the first extraction area 101b, which is located in the upper side of FIG. 5, and the extending direction of the gate trench 17f in the second extraction area 101c, which is located in the lower side of FIG. 5, both are extending in the vertical direction of FIG. 5, are aligned on the same straight line. Inside the gate trench 17f in the second extraction area 101c, a gate electrode 19f is buried via a gate insulating film 18f. Likewise, in each of the gate trenches 12h, 12j, 12l in the first extraction area 101b and each of the gate trenches 17h, 17j, 17l in the second extraction area 101c, the corresponding extending direction of the gate trenches, which are extending in the vertical direction in FIG. 5, are aligned on the same straight line, respectively.

As illustrated in FIG. 5, a strip-shaped gate runner 20 is provided on the tips of the gate trenches 12f, 12h, 12j, 12l and the tips of the gate trenches 17f, 17h, 17j, 17l, which are adjacent to each other via the interspace. The gate runner 20 extends perpendicularly to the extending direction of the gate trenches 12f, 12h, 12j, 12l (the longitudinal direction of the trenches) and in parallel to the interspace between the first extraction area 101b and the second extraction area 101c with a constant width. The gate runner 20 concurrently overlaps on the tips of the gate electrodes 14f, 14h, 14j, 14l in the gate trenches 12f, 12h, 12j, 12l in the first extraction area 101b and the tips of the gate electrodes 19f, 19h, 19j, 19l in the gate trenches 17f, 17h, 17j, 17l in the second extraction area 101c.

On the other hand, the lower tips of the three dummy trenches 12g, 12i, 12k located in the center portion in the first extraction area 101b in FIG. 5 recede with a certain distance toward the upper side from the lower tips of the adjacent gate trenches 12f, 12h, 12j, 12l. The lower tip of dummy trench 12g in the left side in FIG. 5 is withdrawn upward so as to be located above the coupling trench 16a of the gate trenches 12f, 12h which is located on the left and right of the dummy trench 12g. The lower tip of the dummy trench 12k in the right side in FIG. 5 is withdrawn upward so as to be located above the coupling trench 16b of the left and right gate trenches 12j, 12l which is located on the left and right of the dummy trench 12k.

Therefore, the zone of the gate runner 20 is electrically connected only to the gate electrodes 14f, 14h, 14j, 14l inside the gate trenches 12f, 12h, 12j, 12l in the first extraction area 101b and the gate electrodes 19f, 19h, 19j, 19l inside the gate trenches 17f, 17h, 17j, 17l in the second extraction area 101c. Moreover, the zone of the gate runner 20 is electrically isolated from each of the dummy electrodes 14g, 14i, 14k inside the dummy trenches 12g, 12i, 12k. In the lower tips of the dummy trenches 12g, 12i, 12k, each of the dummy electrodes 14g, 14i, 14k is electrically connected to corresponding dummy contact pads 15g, 15i, 15k, respectively.

In the IGBT according to the embodiment of the present invention, as illustrated in FIG. 2, the area of the "extraction area" implemented by the first extraction area 101b and the second extraction area 101c is four times or more the area of the sensing area 101a. Thus, the gate-emitter capacitance $C_{ge}$ is increased. When the area of the "extraction area" is less than four times the area of the sensing area 101a, the ESD tolerance of the current sense cell 101 may not be sufficiently secured. When the area of the "extraction area" exceeds 10000 times the area of the sensing area 101a, the entire area of the current sense cell 101 may be excessively increased, and the effective area in the semiconductor chip may be decreased.

For example, each peripheral area of the sensing area 101a in the lateral direction in FIG. 3 can be defined by a center line bisecting each width in the lateral direction of the gate trench 12f at the left end and the gate trench 12l at the right end of the sensing area 101a. Further, as each peripheral area of the sensing area 101a in the vertical direction in FIG. 3, a lateral imaginary line extending along the upper side of the uppermost $n^+$-type emitter regions having rectangular-shape of the trenches 12f, 12g, 12h, 12i, 12j, 12k, 12l, and a lateral imaginary line extending along the lower side of the lowermost $n^+$-type emitter regions having rectangular-shape of the trenches 12f, 12g, 12h, 12i, 12j, 12k, 12l can be used. Moreover, the "extraction area" can be defined as a region surrounded by outermost gate trenches at both ends in the direction in which the trenches are arranged in parallel, as a plane pattern.

Figure 6:
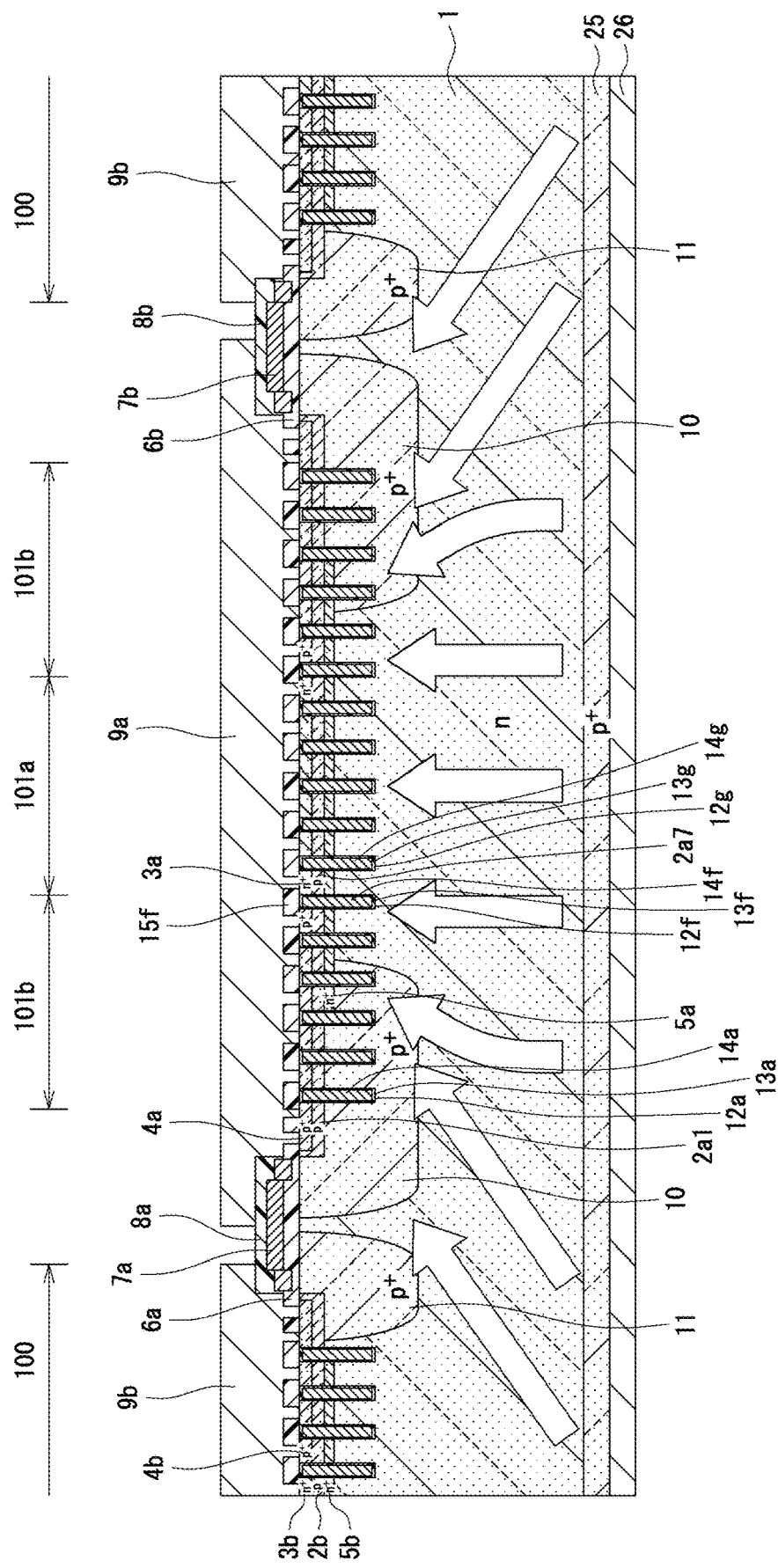
FIG. 6 is a cross-sectional view illustrating a state in which a hole current flowing through the current sense cell included in the IGBT according to the embodiment is drawn.

As illustrated in FIG. 6, during operation of the IGBT, a hole current flows from the collector electrode 26 toward the emitter electrodes 9a, 9b. The hole current flows from both the current sense cell 101 and the active cell of the active area 100. As illustrated in FIGS. 2 and 4, in the current sense cell 101 of the IGBT according to the embodiment of the present invention, the well region 10 having a thickness deeper than the gate trenches 12a is provided over the first extraction area 101b and the second extraction area 101c. Therefore, the hole current is promoted to flow toward the first extraction area 101b and the second extraction area 101c, whereby charging of the carrier to the gate electrode in the sensing area 101a side may be prevented. As a result, an increase in the gate-collector capacitance $C_{gc}$ may be prevented.

<Comparative Example>

Figure 7:
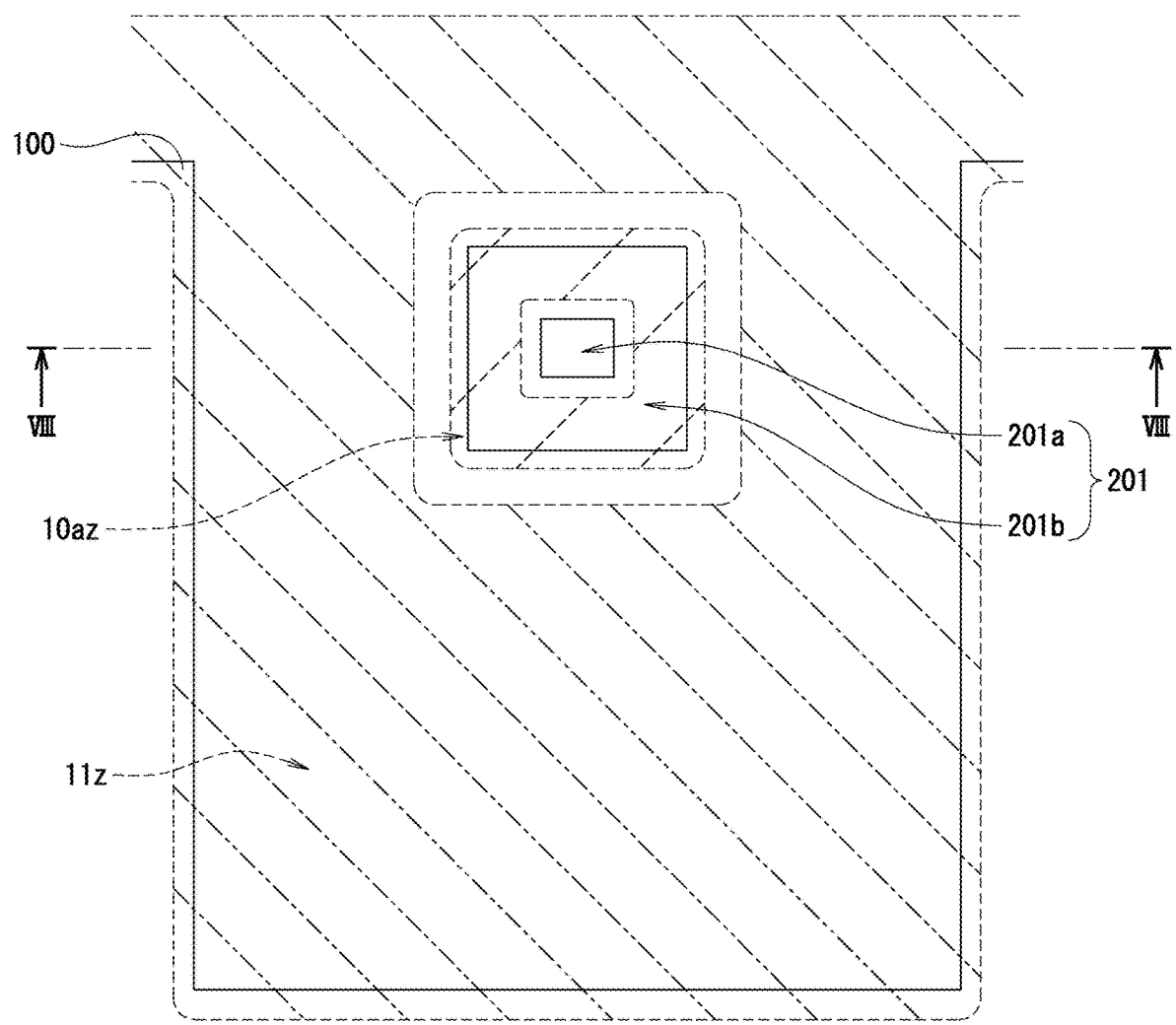
FIG. 7 is a schematic plan view illustrating a structure of a current sense cell included in an IGBT according to a comparative example.
Figure 8:
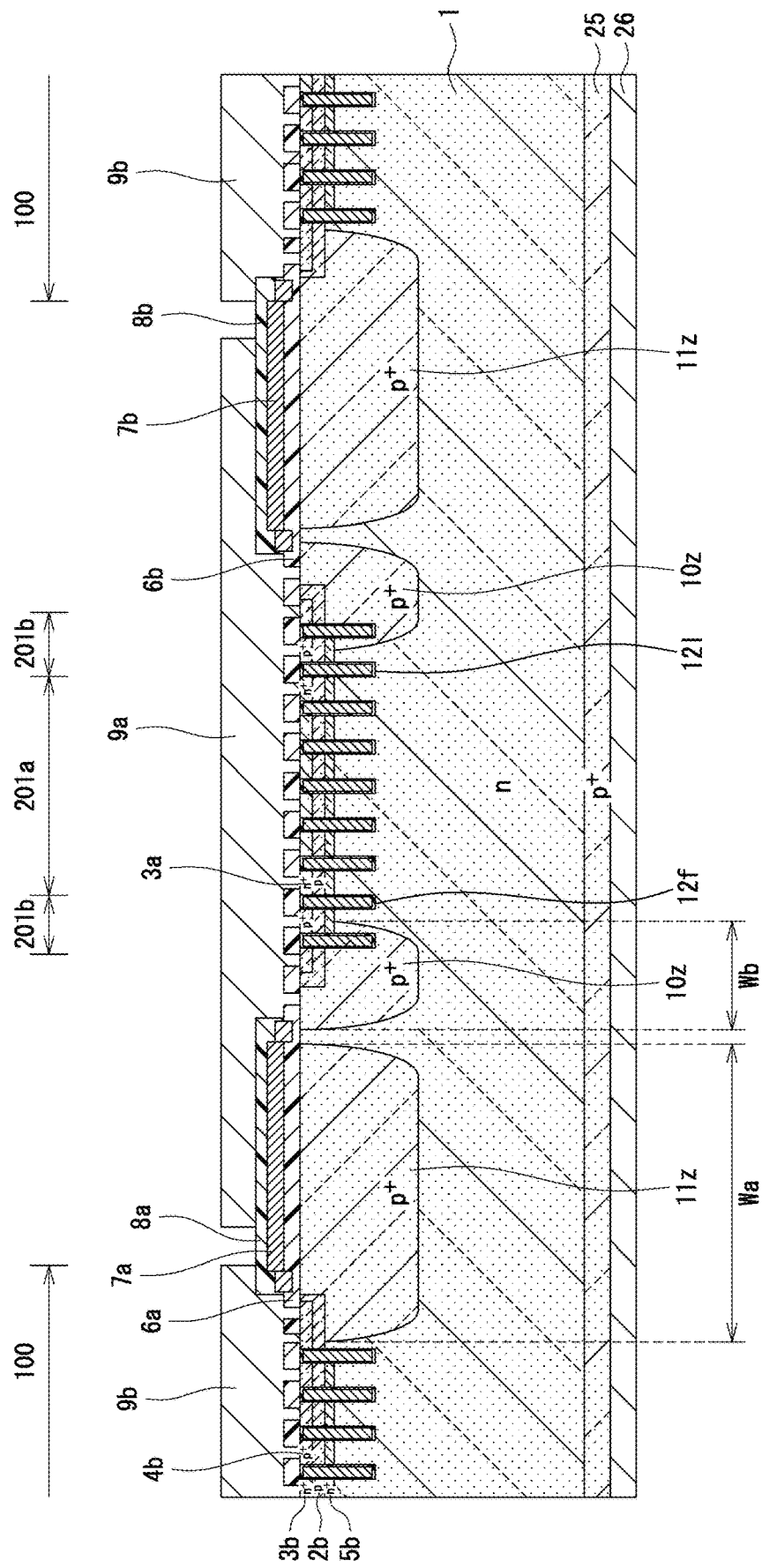
FIG. 8 is a cross-sectional view of a main part taken along the line VIII-VIII in FIG. 7.

As illustrated in FIG. 7, an IGBT including a current sense cell 201 having a sensing area 201a and an extraction area 201b provided around the sensing area 201a has been prepared as a comparative example. In the IGBT according to the comparative example, the area of the extraction area 201b is decreased to about 2.5 times the area of the sensing area 201a, so as to be smaller than the case of the embodiment of the present invention in which the area of the extraction area four times or more the area of the sensing area 101a. As illustrated in FIG. 8, in the IGBT according to the comparative example, a width wb of a well region 10z of the extraction area 201b is decreased to be about ⅓ or less of a width wa of a well region 11z of the active area 100.

Figure 9:
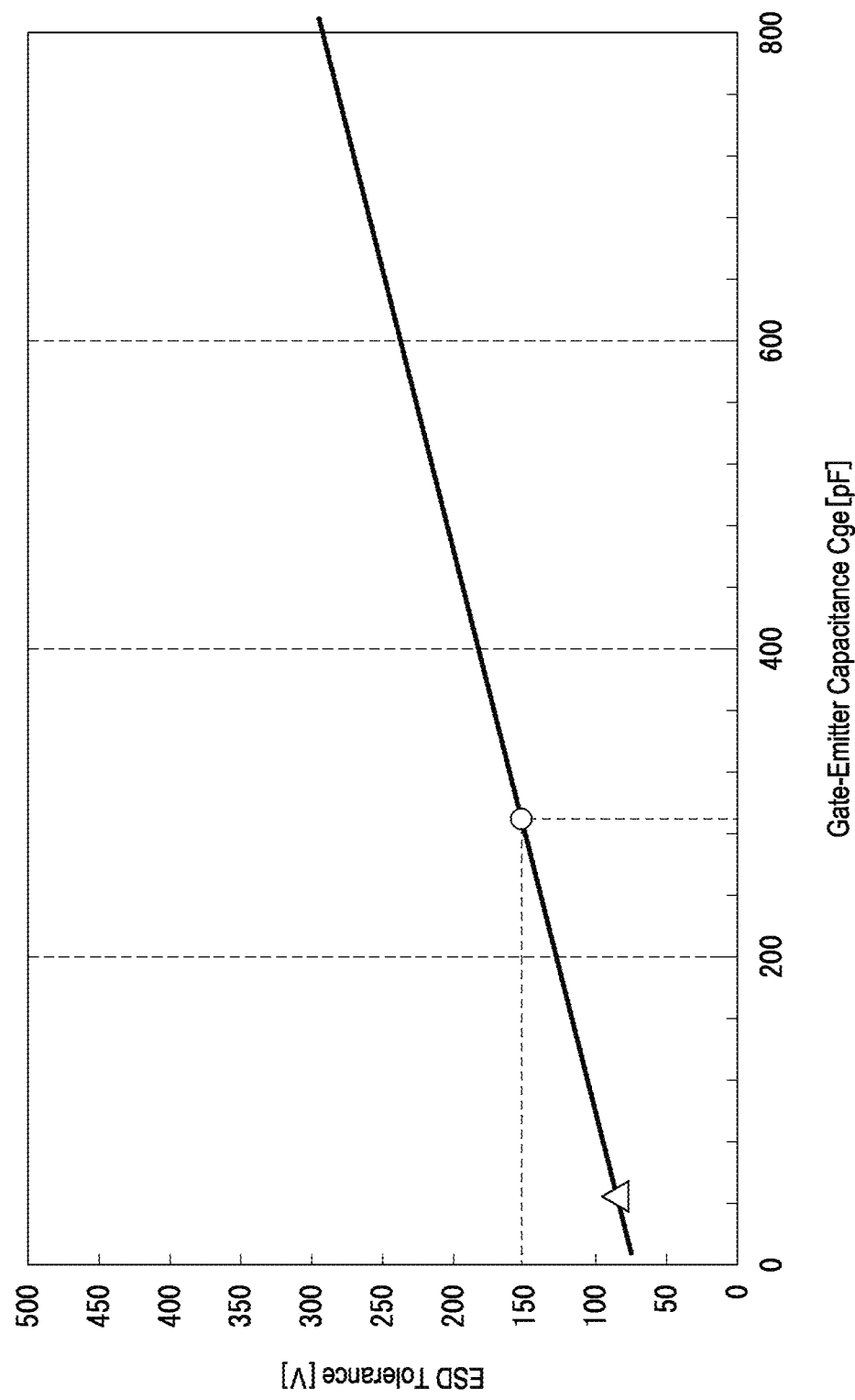
FIG. 9 is a graph for explaining a relationship between gate-emitter capacitance $C_{ge}$ and ESD tolerance.

In the IGBT according to the comparative example, because each number of the gate trenches assigned in the extraction areas 201b located right and left sides of the sensing area 201a is one, the number of the gate trenches is significantly reduced as compared with the case of the current sense cell 101 in the IGBT according to the embodiment of the present invention illustrated in FIG. 4. Therefore, as illustrated by a data point of triangle in FIG. 9, in the IGBT according to the comparative example, the gate-emitter capacitance $C_{ge}$ is about 30 picofarads or less and cannot be sufficiently increased, and the ESD tolerance is as extremely low as about 80 volts. Therefore, when a voltage equal to or higher than the gate breakdown voltage is applied, the protection function against overcurrent does not work sufficiently in the IGBT according to the comparative example, and the possibility of destruction of the IGBT increases.

However, in the IGBT according to the embodiment of the present invention, the gate trenches 12a are disposed over the entire surface of the first extraction area 101b and the second extraction area 101c, and by providing the gate electrodes on each of the first extraction area 101b and the second extraction area 101c, the gate-emitter capacitance $C_{ge}$ may be increased to 290 picofarads or more. Therefore, as illustrated by a data point of circle in FIG. 9, it is possible to secure the ESD tolerance of about 150 volts or more, which is about twice or more as compared with the case of the comparative example.

In the IGBT according to the embodiment of the present invention, a large number of the gate trenches in which the gate electrodes are buried, are disposed in the first extraction area 101b and the second extraction area 101c around the sensing area 101a. Therefore, it is possible to significantly increase the gate-emitter capacitance $C_{ge}$ of the current sense cell 101, and to secure the ESD tolerance to a large extent. In addition, since the well region 10 having a thickness deeper than the gate trench 12a is provided in a wide range over the first extraction area 101b and the second extraction area 101c, accumulation of carriers in the gate electrodes may be prevented during operation. Therefore, it is possible to reduce the Miller capacitance by decreasing the gate-collector capacitance $C_{gc}$ of the current sense cell 101, and to avoid collapse of the capacitance balance between the current sense cell 101 and the active area 100 due to the arrangement of the trenches in the first extraction area 101b and the second extraction area 101c around the sensing area 101a.

Further, even when the sensing area 101a in the current sense cell 101 has the same area as the conventional IGBT on the semiconductor chip, as illustrated in FIG. 4, the width wb of the deep well region 10 extending over the first extraction area 101b and the second extraction area 101c is much wider than the width wa of the well region 11 of the adjacent active area 100. Then, it is possible to effectively satisfy both of the capacitance balance between the current sense cell 101 and the active area 100 and the ESD tolerance of the current sense cell 101.

In the IGBT according to the embodiment of the present invention, the area ratio of the "extraction area" including the first extraction area 101b and the second extraction area 101c to the sensing area 101a is intentionally controlled so that the area of the extraction area is set to be four times or more and 10,000 times or less the area of the sensing area 101a. Therefore, it is possible to more reliably satisfy both of avoiding collapse of the capacitance balance between the current sense cell 101 and the active area 100 and securing the ESD tolerance of the current sense cell 101.

In the IGBT according to the embodiment of the present invention, the width wb of the well region 10 extending from the first extraction area 101b is set to be 1.5 times or more and 300 times or less, preferably about 2.5 times wider than the width wa of the well region 11 extending from the active area 100. Therefore, it is possible to more reliably prevent the collapse of the capacitance balance between the current sense cell 101 and the active area 100.

In the IGBT according to the embodiment of the present invention, as illustrated in FIG. 5, both of the lower tips of the dummy trenches 12g, 12i, 12k and the lower tips of the gate trenches 12f, 12h, 12j, 12l are located at different positions from each other. Therefore, when connecting the gate electrodes 14f, 14h, 14j, 14l, 19f, 19h, 19j, 19l buried in the gate trenches 12f, 12h, 12j, 12l, 17f, 17h, 17j, 17l of the first extraction area 101b and the second extraction area 101c with the gate runner 20, the gate runner 20 does not interfere with the lower tips of the dummy trench 12g, 12i, 12k, and the dummy electrode 14g, 14i, 14k buried inside the dummy trenches 12g, 12i, 12k can be electrically connected to the emitter potential without being connected to the gate potential. Therefore, even in the case where the gate trenches 12f, 12h, 12j, 12l and the dummy trenches 12g, 12i, 12k are provided in parallel in the sensing area 101a of the current sense cell 101 in response to the unit cell structure of the active area 100, it is possible to apply the gate potential to the gate electrodes 14f, 14h, 14j, 14l using a simple strip-shaped gate runner 20. Further, a desired potential different from the gate potential can be electrically connected to the dummy electrodes 14g, 14i, 14k. In addition, the dummy electrodes 14g, 14i, 14k may be used electrically in a floating condition.

<Modified Example>

Figure 10:
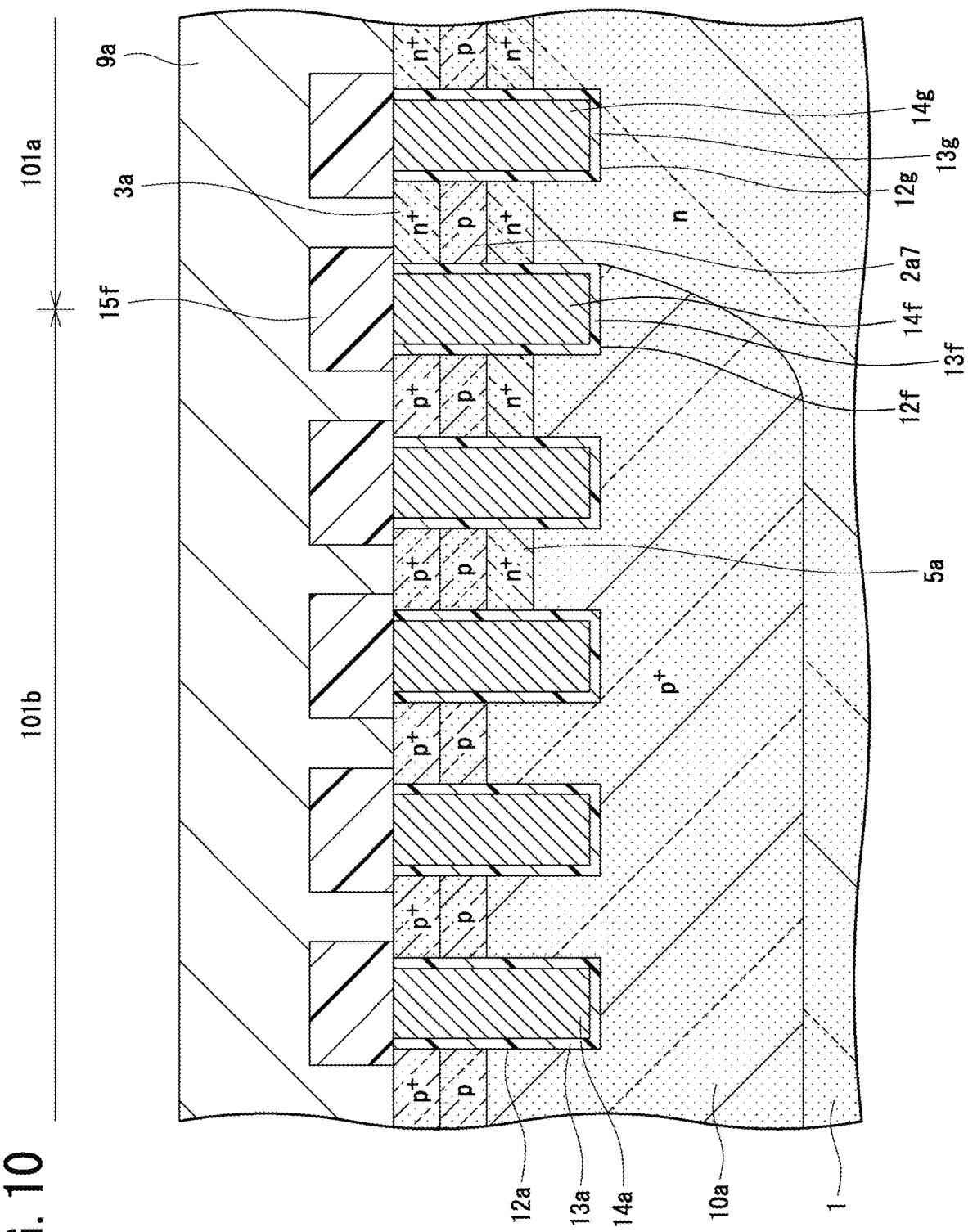
FIG. 10 is a cross-sectional view of a main part schematically illustrating an example of a structure of an IGBT according to a modified example.

In an IGBT according to a modified example of the present invention, the well region 10a may extend to the bottom of the trench 12f which is located at the boundary between the sensing area 101a and the first extraction area 101b as illustrated in FIG. 10, as long as a well region 10a does not overlap with the emitter region 3a. FIG. 10 exemplifies the cross-sectional view of the IGBT according to the modified example in the case where the tip of the well region 10a on the sensing area 101a side is located at the right end of the bottom portion of the gate trench 12f. Since the other structures of the IGBT according to the modified example are equivalent to constituent members having the same name in the IGBT according to the embodiment of the present invention, respectively, the redundant description will be omitted. In the IGBT according to the modified example, by extending the width of the well region 10a to the boundary limit in which the well region 10a does not overlap with the emitter region 3a, the effectiveness of reducing the gate-collector capacitance $C_{gc}$ can be maximized. The other effects of the IGBT according to the modified example are the same as those of the IGBT according to the embodiment of the present invention.

<Other Embodiments>

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

For example, the shapes of the active area 100 and the current sense cell 101, and the respective arrangements are not limited to those described in the above embodiments, and can be changed as appropriate. Further, in the embodiment of the present invention, the first extraction area 101b includes the portions not in contact with the emitter region 3a in the dummy trenches 12g, 12i, 12k, but the present invention is not limited thereto. It is possible to increase the gate-emitter capacitance $C_{ge}$, even when all of the trenches provided in the extraction area are used as the gate trenches in which the gate electrodes are buried. That is, at least one gate trench for increasing the gate-emitter capacitance $C_{ge}$ may be provided in the extraction area.

It should be noted that the present invention includes various embodiments which are not disclosed herein. Therefore, the scope of the present invention is defined only by the present invention specifying matters according to the claims reasonably derived from the description heretofore.

What is claimed is:

1. An insulated gate bipolar transistor, comprising:
   a drift layer of a first conductivity type;
   a base region of a second conductivity type provided on the drift layer;
   an emitter region of the first conductivity type provided on a part of the base region and having a higher impurity concentration than the drift layer;
   a gate electrode buried in a first trench penetrating through at least the base region via a first insulating film;
   a collector region of the second conductivity type provided under the drift layer;
   a current sense cell, including:
     a sensing area in which the emitter region is provided, having a portion in contact with the emitter region in the first trench, configured to sense a current flowing in an active area, and
     an extraction area provided around the sensing area, such that between the extraction area and the sensing area the base region is provided and the emitter region is not provided, having a portion in the first trench not in contact with the emitter region and having a first well region of the second conductivity type in an upper layer of the drift region, configured to extract a hole current flowing from the collector region through the first well region, wherein the first well region is provided deeper than the first trench and has a higher impurity concentration than the base region, and an area of the extraction area is four times or more and 10,000 times or less an area of the sensing area in the planar pattern.

2. The insulated gate bipolar transistor of claim 1, wherein,
   the current sense cell further includes a dummy electrode buried in a second trench penetrating through at least the base region via a second insulating film and connected to a potential other than a gate potential applied to the gate electrode, and
   the second trench is provided at least in the sensing area.

3. The insulated gate bipolar transistor of claim 2, wherein, as a planar pattern, the extraction area includes:
   a first extraction area surrounding the sensing area, and
   a second extraction area facing toward the first extraction area, separated from the first extraction area by an interspace provided in a longitudinal direction of the first trench.

4. The insulated gate bipolar transistor of claim 3, wherein
   in the first extraction area, a tip of the second trench, which is facing toward the interspace in parallel with the first trench, recedes by a certain distance from a tip of the first trench in a direction opposite of a direction to the second extraction area, and
   tip of the first trench provided in the first extraction area and a tip of a first trench provided in the second extraction area, each face the interspace, and are electrically connected by a strip-shaped gate runner.

5. The insulated gate bipolar transistor of claim 4, wherein, the dummy electrode is electrically connected to an emitter potential.

6. The insulated gate bipolar transistor of claim 1, wherein a width of the first well region extending from the extraction area is 1.5 times or more and 300 times or less a width of a second well region provided at a periphery of the active area and adjacent to the first well region.

7. The insulated gate bipolar transistor of claim 1, wherein the first well region extends to the bottom of the first trench located at the boundary between the sensing area and the extraction area where a tip of the first well region is located at an end of the bottom of the first trench.

8. The insulated gate bipolar transistor of claim 1, wherein the gate electrode of the first trench in the extraction area is electrically connected to a gate potential.

9. The insulated gate bipolar transistor of claim 1, wherein, a bottom of the first trench in the extraction area is provided in the first well region.

10. The insulated gate bipolar transistor of claim 1, wherein
the extraction area includes a plurality of first trenches, each of the plurality of first trenches having a gate electrode buried therein which is connected to a gate potential, and
the sensing area includes a plurality of gate trenches and a plurality of dummy trenches, each of the plurality of dummy trenches being provided between adjacent gate trenches among the plurality of gate trenches and not being connected to the gate potential, and each of the plurality of gate trenches having a gate electrode buried therein which is connected to the gate potential.

11. The insulated gate bipolar transistor of claim 10, wherein the plurality of first trenches includes at least five trenches.

12. The insulated gate bipolar transistor of claim 1, further comprising a second well region provided around the first well region, and which at least partially overlaps the active area,
wherein
the first well region has a first width, in a direction perpendicular to a longitudinal direction of the first trench, which extends from the extraction area toward the second well region,
the second well region has a second width, in the direction perpendicular to the longitudinal direction of the first trench, which extends from the active area toward the first well region, and
the first width is 1.5 times or more and 300 times or less than the second width.

13. The insulated gate bipolar transistor of claim 1, wherein an electrostatic discharge tolerance of the insulated gate bipolar transistor is about 150 volts and a gate-emitter capacitance of the insulated gate bipolar transistor is about 290 picofarads.

* * * * *

UNITED STATES PATENT AND TRADEMARK OFFICE
CERTIFICATE OF CORRECTION

PATENT NO. : 10,566,448 B2
APPLICATION NO. : 16/171535
DATED : February 18, 2020
INVENTOR(S) : Tohru Shirakawa Page 1 of 1

It is certified that error appears in the above-identified patent and that said Letters Patent is hereby corrected as shown below:

In the Claims

Column 14, Line 64, Claim 4, before "tip of the first trench" insert -- a --.

Signed and Sealed this
Thirty-first Day of March, 2020

Andrei Iancu
*Director of the United States Patent and Trademark Office*